United States Patent [19]

Land et al.

[11] 4,391,901
[45] Jul. 5, 1983

[54] PHOTOSENSITIVITY ENHANCEMENT OF PLZT CERAMICS BY POSITIVE ION IMPLANTATION

[75] Inventors: Cecil E. Land; Paul S. Peercy, both of Albuquerque, N. Mex.

[73] Assignee: The United States of America as represented by the United States Department of Energy, Washington, D.C.

[21] Appl. No.: 343,612

[22] Filed: Jan. 28, 1982

Related U.S. Application Data

[63] Continuation-in-part of Ser. No. 159,318, Jun. 13, 1980, abandoned.

[51] Int. Cl.$^3$ ............................................... G03C 1/00
[52] U.S. Cl. ................................. 430/495; 430/84; 430/19; 430/962; 430/95; 350/390; 350/356; 252/62.9; 252/501.1; 501/134; 365/109; 365/117; 365/119; 365/145; 365/157
[58] Field of Search .................. 430/84, 19, 95, 962, 430/495, 540; 350/390, 356; 252/62.9 PZ, 501.1; 106/73.2; 365/109, 117, 119, 145, 157

[56] References Cited

U.S. PATENT DOCUMENTS

| 3,868,653 | 2/1975 | Winter | 365/117 |
| 3,978,458 | 8/1976 | Vergnolle et al. | 365/117 |
| 4,135,224 | 1/1979 | Maher | 106/73.2 |
| 4,158,201 | 6/1979 | Smith et al. | 365/117 |

FOREIGN PATENT DOCUMENTS 51-98999  8/1976  Japan .

OTHER PUBLICATIONS

Land et al., "New Image Storage Mechanisms in PLZT Ceramics using Near-UV," IEEE-SID Biennial Display Conference Record, pp. 71-75 (Oct., 1976).

Primary Examiner—Won H. Louie, Jr.

[57] ABSTRACT

The photosensitivity of lead lanthanum zirconate titanate (PLZT) ceramic material used in high resolution, high contrast, and non-volatile photoferroelectric image storage and display devices is enhanced significantly by positive ion implantation of the PLZT near its surface. Implanted ions include $H^+$, $He^+$, $Ne^+$, $Ar^+$, as well as chemically reactive ions from Fe, Cr, and Al. The positive ion implantation advantageously serves to shift the absorption characteristics of the PLZT material from near-UV light to visible light. As a result, photosensitivity enhancement is such that the positive ion implanted PLZT plate is sensitive even to sunlight and conventional room lighting, such as fluorescent and incandescent light sources. The method disclosed includes exposing the PLZT plate to the positive ions at sufficient density, from $1 \times 10^{12}$ to $1 \times 10^{17}$, and with sufficient energy, from 100 to 500 KeV, to provide photosensitivity enhancement. The PLZT material may have a lanthanum content ranging from 5 to 10%, a lead zirconate content of 62 to 70 mole %, and a lead titanate content of 38 to 30%. The ions are implanted at a depth of 0.1 to 2 microns below the surface of the PLZT plate.

11 Claims, 6 Drawing Figures

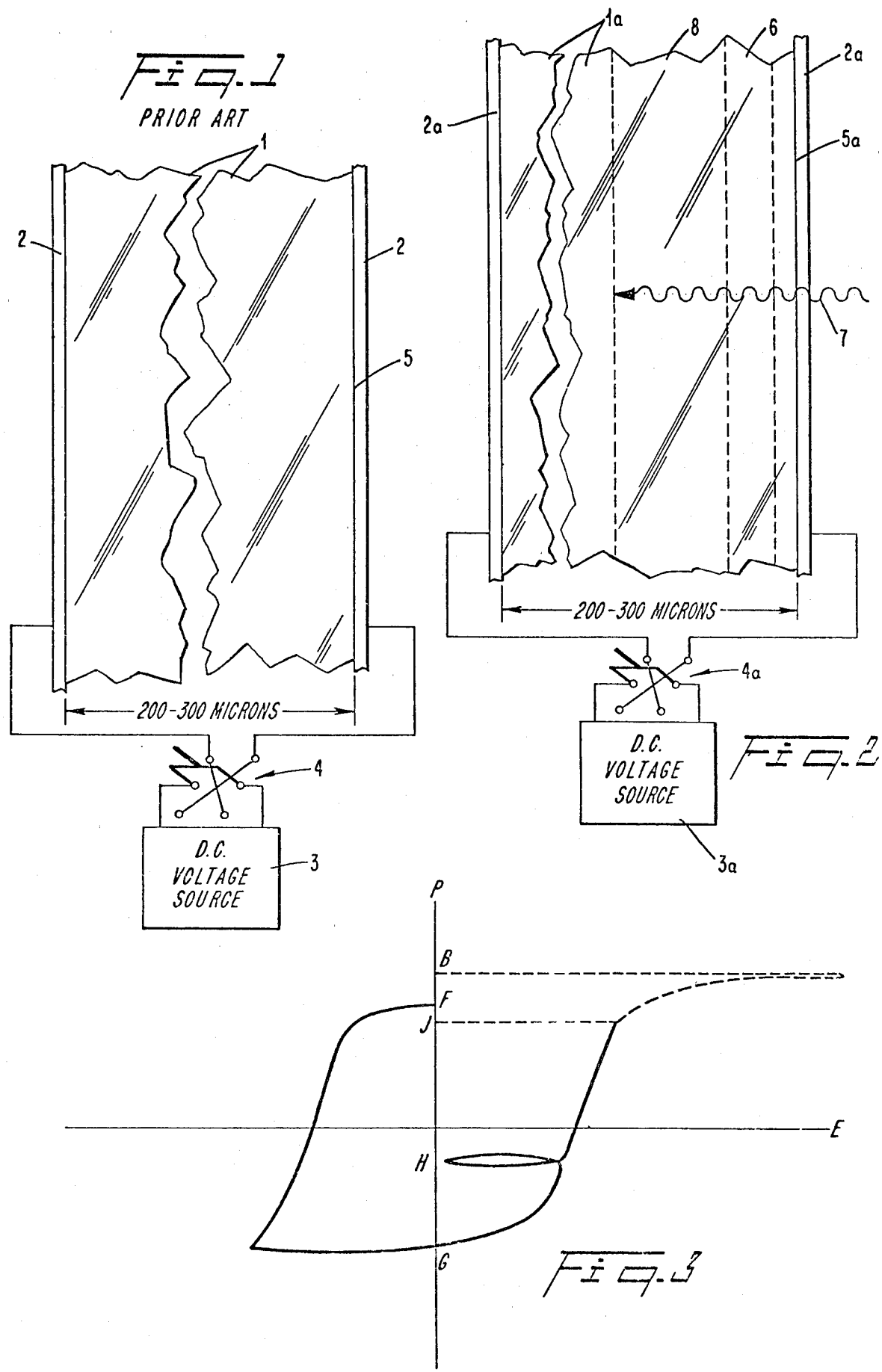

PHOTORESPONSE OF PLZT CERAMIC IMPLANTED WITH POSITIVE INERT IONS.

PHOTORESPONSE OF PLZT CERAMIC IMPLANTED WITH POSITIVE INERT AND CHEMICALLY REACTIVE IONS.

PHOTORESPONSE OF PLZT CERAMIC COIMPLANTED WITH POSITIVE INERT AND CHEMICALLY REACTIVE IONS.

PHOTOSENSITIVITY ENHANCEMENT OF PLZT CERAMICS BY POSITIVE ION IMPLANTATION

The United States Government has rights in this invention pursuant to Contract No. AT(29-1)-789 and modifications, between the U.S. Department of Energy and Western Electric Co., Inc.

This application is a continuation-in-part of patent application Ser. No. 159,318 filed on June 13, 1980, abandoned and entitled "Photosensitivity Enhancement of PLZT Ceramics by Positive Ion Implantation."

BACKGROUND OF THE INVENTION

The invention is in the field of high resolution, high contrast image storage and display devices using lead lanthanum zirconate titanate (PLZT) ceramics.

Current image storage and display devices are limited in their applications by the intensity of the light source which must be employed. Among the image storage devices employing PLZT, ceramics, a particularly advantageous device is described in the following publications:

C. E. Land, "Information Storage and Display Techniques Using PLZT Ceramics," Proceedings of the Society of Photooptical Institute Engineers, Vol. 83, pages 44–50 (August, 1976);

C. E. Land and P. S. Peercy, "New Image Storage Mechanisms in PLZT Ceramics Using Near-Ultraviolet Light," IEEE-SID Biennial Display Conference Record, pages 71–75 (October, 1976);

C. E. Land and P. S. Peercy, "Photoferroelectric Image Storage in PLZT Ceramics," Information Display Journal, Vol. 13, pages 20–26 (1977);

C. E. Land, "Optical Information Storage and Spatial Light Modulation in PLZT Ceramics," Optical Engineering, Vol. 17, pages 317–326 (1978);

C. E. Land and P. S. Peercy, "Photoferroelectric Image Storage and Contrast Modification in PLZT Ceramics," 1978, SID International Symposium Digest of Technical Papers 9, pages 14–15, April, 1978; and C. E. Land, "Photoferroelectric Image Storage in Anti-Ferroelectric Phase PLZT Ceramics," 1978, IEEE-SID Biennial Display Research Conference Record, pages 38–41 (October, 1978).

In these articles, a device for storing high resolution, high contrast, non-volatile images is disclosed using a rhombohedral-phase PLZT ceramic plate. The PLZT ceramic plate undergoes a photoferroelectric effect (PFE). Images are stored by simultaneously exposing the image on a surface of the plate using near-UV light at or near the band gap energy of the PLZT material (about 3.35 eV or 0.37 micrometers) and switching the ferroelectric polarization through a portion of the hysteresis loop generated by an electric field generator.

More particularly, to store an image using the PFE effect, the remanent polarization of the ceramic is first switched to a point near saturation remanence. The UV image is then exposed on one of the surfaces of the ceramic and the ceramic polarization is reversed by reversing the polarity of the applied electric field. The UV illumination is removed, and the image which was stored may be exhibited as a positive image or a negative image merely by increasing, decreasing, or reversing the remanent polarization. The stored image may subsequently be switched from a positive to a negative without further exposure to UV light.

Images are stored as spatial distributions of light scattering centers and as spatial modulation of surface deformation, related to specific domain orientations in the PLZT.

The PFE image storage mechanism is based on localized domain switching which results in a spatial distribution of the light scattering centers and the surface deformation strains created during switching. The physical processes leading to localized domain switching involve optical excitation of carriers, transport of the carriers under the influence of an applied electric field, and retrapping of the carriers at new sites.

To erase the total image or a selected portion thereof, the surface of the plate to be erased is illuminated with UV light of uniform intensity, and the polarization is switched to saturation remanence.

The images may be displayed by projection through a Schlieren optical system. The image may also be displayed upon conventional photographic film as a conventional photograph.

The images can also be viewed or projected by light reflected from the surface exposed to the UV storage light.

A somewhat different type of image storage can be achieved in a penferroelectric-phase PLZT plate by simultaneously exposing the image, using near-UV light, and applying a transverse electric field. Interdigital electrodes are used to apply voltage which produces the transverse electric field. By using interdigital electrodes, the voltage required to obtain halfwave retardation in the ceramic plate depends only on the electrode spacing and the quadratic electro-optic coefficient of the PLZT. In this case, images are stored via the quadratic electro-optic effect as spatial modulation of birefringence.

The energy of the light used to form the image in the currently available PLZT devices is on the order of 85,000 microjoules per square centimeter (micro $J/cm^2$). This energy level requires light sources higher than light energy normally available in a room lighted either by sunlight, fluorescent light, or incandescent lighting.

Another currently available image storage and display device employs a bismuth silicate material, $Bi_{12}SiO_{20}$ (BSO) used in PROM devices. Though somewhat more sensitive than the currently available PLZT devices, the BSO image is volatile, a very undesirable characteristic.

The band gap energy of the current PLZT devices is in the near-UV range. In order to make greater use of ambient light, it would be desirable to shift the photosensitivity toward the visible region of the spectrum.

It is an object of the invention, therefore, to provide a PLZT image storage and display device having enhanced photosensitivity.

Another object of the invention is to provide an image storage and display device having non-volatile image storage, and also being more sensitive than currently available volatile image storage devices.

Another object of the invention is to provide a PLZT image storage and display device that is easily prepared and having the photoferroelectric sensitivity of the PLZT material shifted toward the visible spectrum.

Still other objects, derived benefits and advantages of the present invention will become readily apparent to those skilled in the art from the following detailed description wherein we have shown and described only the preferred embodiments of the invention, simply by way of illustration of the best modes contemplated by us of carrying out our invention. As will be realized, the invention is capable of other and different embodiments and its several details are capable of modification in various, obvious respects, without departing from the invention. Accordingly, the drawings, Tables and description are to be regarded as illustrative in nature, and not as restrictive.

SUMMARY OF THE INVENTION

More specifically, it has been discovered that a significant increase in the photosensitivity of a PLZT material can be obtained in the near ultraviolet and the visible range, or both, by subjecting rhombohedral phase PLZT [7/65/35 (7 atom % a, 65:35 Zr:Ti lead zirconate-lead titanate)] to positive ion implantation at ion densities of $1 \times 10^{12}$ to $1 \times 10^{17}$ ions/cm$^2$ at an energy level of 100 to 500 KeV.

The ions that may be successfully implanted to achieve these results include materials such as hydrogen ions (H+), and inert gases such as helium ions (He+), argon ions (Ar+), neon ions (Ne+), as well as mixtures of these ions. For example, mixtures of Ar+, Ne+, and He+ ions have been found most effective in enhancing intrinsic photosensitivity, i.e., sensitivity in the near-UV band.

Furthermore, increased photoferroelectric sensitivity has also been extended from the near-UV to the visible spectrum by implants of chemically reactive ions, such as aluminum ions, chromium ions, and combinations of such ions or iron ions with inert gas ions.

The ions are implanted in the PLZT material by means of an ion projecting source.

The grain size of the PLZT material may be in the range from 1 to 10 micrometers. The PLZT material may have a lanthanum content ranging from 5 to 10%; a lead zirconate content ranging from 62 to 70 mole %; and a lead titanate content ranging from 38 to 30%.

The preferred region of ion implantation is in a range from 0.1 to 2 microns below the surface of the PLZT plate.

BRIEF DESCRIPTION OF THE DRAWINGS

The accompanying drawings, whih are incorporated in and form a part of the specification, illustrate embodiments of the present invention and, together with the description, serve to explain the principles of the invention. In the drawings:

FIG. 1 shows an idealized cross-section of unimplanted PLZT material of the prior art;

FIG. 2 shows an idealized cross-section of a positive ion implanted PLZT material of the invention.

FIG. 5 shows the photoresponse from 365 nm to about 600 nm of PLZT implanted with chemically reactive ions Fe, Cr, and Al, and Ar, for comparison.

DETAILED DESCRIPTION OF THE INVENTION

Figure 4:
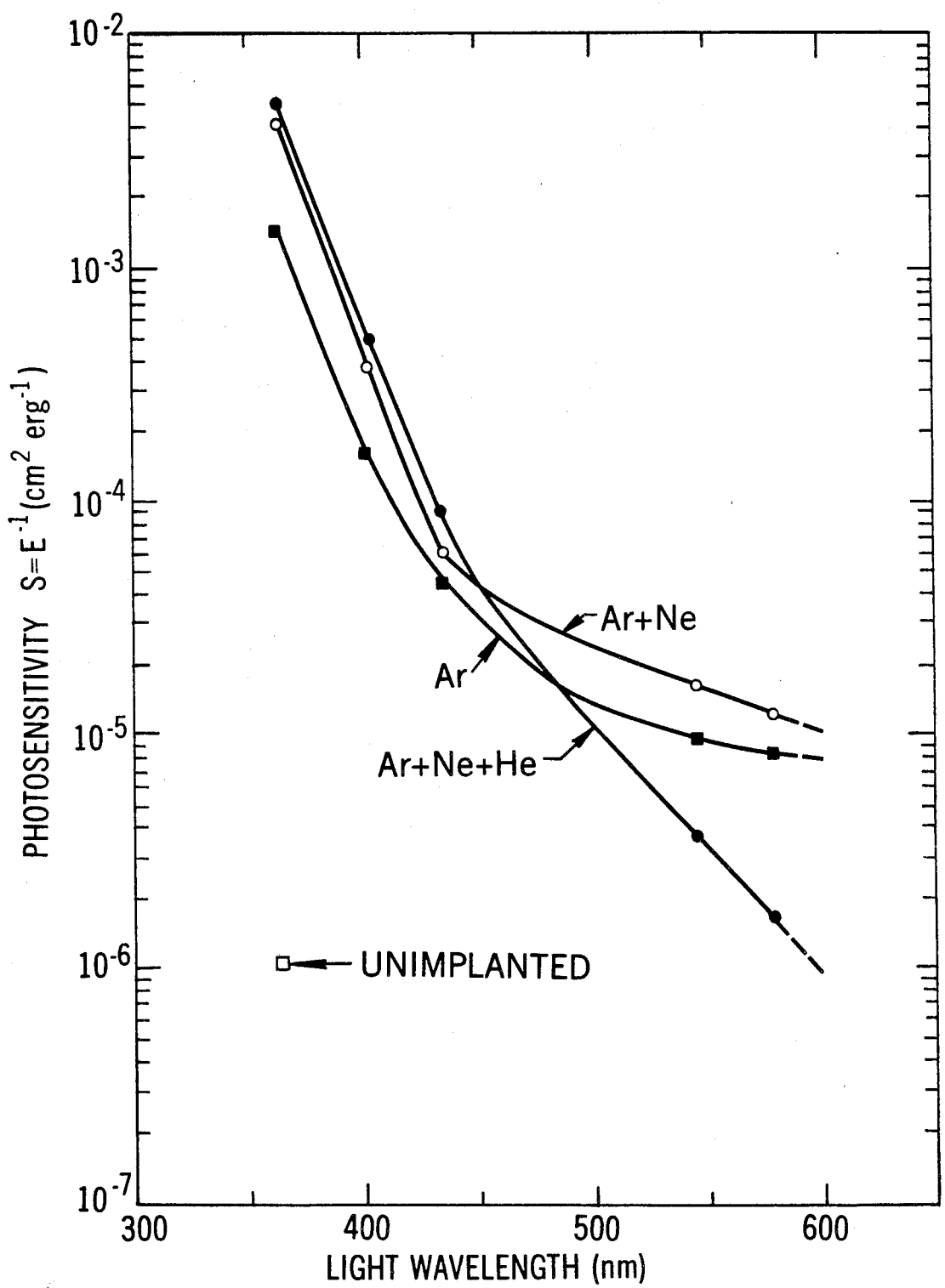
FIG. 4 shows the visible response for PLZT implanted with various inert ions. Also shown is the near-UV response of unimplanted PLZT; the visible response was not measurable.

First, with reference to FIG. 1, a more complete description of the image storage and display device described in the literature reference mentioned above can be provided. The rhombohedral-phase PLZT ceramic plate 1 is positioned between two transparent indium-tin oxide (ITO), low resistance electrodes 2 of an electric field generator. By sputter-deposition, the electrodes are affixed to these two major surfaces of the PLZT ceramic plate.

The overall thickness of the PLZT ceramic plate is between 200 and 300 microns. A voltage from a voltage source 3 is applied through DPDT switch 4 across the PLZT ceramic plate by means of the ITO electrodes. Switch 4 provides reversal of polarity across ITO electrodes and thus provides for reversal of ferroelectric polarization of the PLZT ceramic. By simultaneously exposing the image on a surface 5 of the plate, using near-UV light, and switching the ferroelectric polarization through a portion of the hysteresis loop, the image is stored in the PLZT ceramic plate.

In FIG. 2 in accordance with the present invention, a positive ion implanted PLZT ceramic plate 1a is shown. In this figure, reference indicia for like elements are the same, but with a suffix "a" for additional identification.

A positive ion implantation region 6 from a depth of 0.1 to 2 microns from surface 5a is illustrated. The positive ion implantation should be confined to this near surface region 6 for greatest effectiveness. The light, as represented by ray 7, penetrates into light absorption region 8 extending to a somewhat greater depth; i.e., a depth of approximately 10 microns from the surface 5a. The remainder of the PLZT ceramic material is unilluminated during the course of exposure to light.

As mentioned previously, the ions are implanted into the PLZT material by means of a conventional ion implantation apparatus (not shown).

In developing the principles of the invention, a series of positive ion implanted PLZT materials was produced using a variety of ion materials, a range of ion energies, and a range of ion densities. Table I below presents a graphic view of the improved near-UV photosensitivity results attained by particular positive ions and combinations of ions implanted in PLZT ceramics. The image storage threshold value of an unimplanted ceramic is provided for comparison purposes.

As can be seen from Table I, the unimplanted ceramic has an image storage threshold, for a one-second exposure, of 85,000 micro J/cm$^2$ at the near-UV wavelength of 365 nm. PLZT implanted ceramics, on the other hand, show image storage threshold sensitivities ranging from 10,000 to 20 micro J/cm$^2$, with most of the implanted ions or combinations of ions increasing the PLZT sensitivity by a factor of within the range of about 50 (for Cr ions) to about 4,200 (for the Ar+-Ne+He ion combination).

It can also be seen from the results in Table I, that coimplantation of positive ions further enhances the photosensitivity of the PLZT plate. For example, the plate implanted with Ar ions alone has a threshold of 100 micro J/cm$^2$ while that implanted with Ar and Ne ions has a threshold of 50 micro J/cm$^2$, a two-fold increase in sensitivity. Similar observations can be made from the results of plates implanted with Fe, Al, Cr, and other Ar coimplantations.

Although, as just demonstrated, ion implantation produces dramatic enhancements in photosensitivity in the near-UV region of the spectrum, it has been found that the best enhancements in photoresponse in the visible spectrum have been achieved by implantation of metallic chemically active ions implanted alone or coimplanted with neutral ions such as Ar and Ne.

Figure 6:
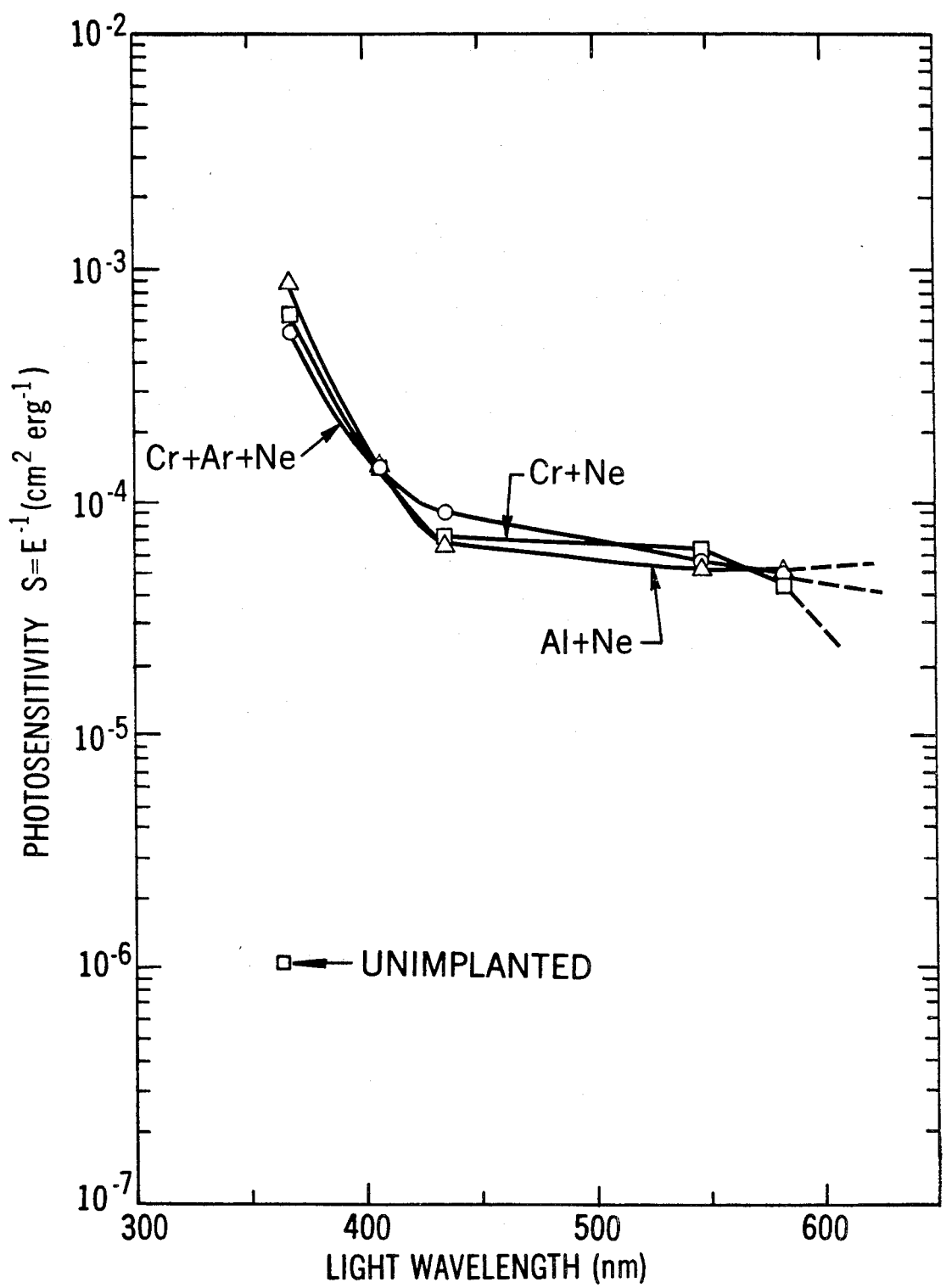
FIG. 6 shows the photoresponse from 365 to about 600 nm of PLZT coimplanted with chemically reactive and chemically inert ions.

The results of these implantations and coimplantations are presented in Table II and graphically illustrated in FIGS. 4, 5, and 6. These figures also contain the near-UV data of Table I, for comparison purposes.

TABLE I

| Example | Ion Source | Ion Implant Energy (keV) | Ion Density (Ion/cm$^2$) | Image Storage Threshold for 1 Sec. Exposure (365 nm) (Micro J/cm$^2$) |
|---|---|---|---|---|
| 1 | None | — | — | 85,000 |
| 2 | H | 200 | 1-4 × 10$^{16}$ | 10,000 |
| 3 | He | 200 | 2-6 × 10$^{15}$ | 3,000 |
| 4 | Ar | 400 | 5 × 10$^{14}$ | 100 |
| 5 | Ar + | 500 | 5 × 10$^{14}$ | 24 |
|   | Ne | 450 | 1.4 × 10$^{15}$ |  |
| 6 | Ar + | 350 | 3 × 10$^{14}$ | 20 |
|   | Ne + | 500 | 1.5 × 10$^{15}$ |  |
|   | He | 250 | 3.24 × 10$^{15}$ |  |
| 7 | Fe | 500 | 3 × 10$^{14}$ | 441 |
| 8 | Fe + | 500 | 3 × 10$^{14}$ | 40 |
|   | Ne | 500 | 1 × 10$^{15}$ |  |
| 9 | Al | 500 | 1 × 10$^{15}$ | 240 |
| 10 | Cr | 500 | 7 × 10$^{14}$ | 1,848 |
| 11 | Al + | 500 | 6.6 × 10$^{14}$ | 75 |
|   | Ne | 500 | 1.5 × 10$^{14}$ |  |
| 12 | Al + | 500 | 8.3 × 10$^{14}$ | 104 |
|   | Ne | 500 | 1 × 10$^{15}$ |  |
| 13 | Cr + | 500 | 5 × 10$^{14}$ | 140 |
|   | Ne | 500 | 1.12 × 10$^{14}$ |  |
| 14 | Ar + | 500 | 3 × 10$^{14}$ | 160 |
|   | Cr + | 500 | 5 × 10$^{14}$ |  |
|   | Ne | 500 | 8 × 10$^{14}$ |  |

For convenience in visualization, the photosensitivities shown in Table II are expressed in micro J/cm$^2$ (as in Table I), while each corresponding value plotted in the Figures, namely S, is the reciprocal of the corresponding table value in ergs/cm$^2$. It should be noted also that the implant energies and the ion densities for the PLZT's whose photosensitive behavior is shown in the Figures are those presented in Tables I and II. Lastly, it should be kept in mind that while the three Figures shown, as a point of reference, a photosensitivity value at λ=365 nm for unimplanted PLZT material, that starting material is insensitive to visible light. In fact, no measurable photosensitivity could be detected for λ≧404 nm.

To recapitulate, FIG. 4 illustrates the data of Tables I and II concerning the photosensitivity behavior of PLZT implanted with inert ions for the near-UV and visible light spectrum. FIG. 5 does the same for chemically reactive ion implants and Ar, for comparison, while FIG. 6 deals with chemically reactive ions coimplanted with inert ions.

Some of the actual data generated in these implantation studies will now be reported in Table II. The nonimplanted and the implanted PLZT samples are the same as those shown in Table I, and thus have the same implant energies and ion concentrations.

As can be seen from the results in Table II, as well as from the Figures, all positive ion implants, except iron (Examples 7 and 8, and FIG. 4), impart useful photosensitivity to PLZT ceramic in the visible light range of the spectrum. As the data shows, the best single chemically reactive ion implant is provided by aluminum (Example 9 and FIG. 5).

Better yet, in terms of greatest and most uniform and extrinsic photosensitivity, the co-implants of aluminum or chromium with inert gas ions are most favored (Examples 12, 13, and 14; FIG. 6).

It can be concluded, therefore, that by using the concept of ion implantation disclosed here, light energy of fairly low level can be successfully received and stored as an image with greatly enhanced sensitivity in both the near-UV and the visible spectra.

Data developed in the course of reducing the present concept to practice indicate that the depth of implantation of the ionic material in region 6 of FIG. 2 is an inverse function of the atomic mass of such material. Thus, the lightest ion, H+, is implanted at a depth of 1.2 microns, while a heavier one such as Ar+, reaches a depth of only 0.25 microns. Other ions behave accordingly.

The useful range of ion density varies for each indi-

TABLE II

PHOTOSENSITIVITY OF PLZT CERAMIC IMPLANTED WITH CHEMICALLY REACTIVE POSITIVE IONS

| | Example: | | | | | | | | |
|---|---|---|---|---|---|---|---|---|---|
| | 7 | 8 | 9 | 11 | 12 | 10 | 13 | 14 | 5 |
| | Implants: | | | | | | | | |
| Wavelength (nm) | (Fe) | (Fe + Ne) | (Al) | (Al + Ne)$^3$ | (Al + Ne)$^3$ | (Cr) | (Cr + Ne) | (Ar, Cr, Ne) | (Ar, Ne)$^4$ |
| 365 | 441 | 40 | 240 | 75 | 104 | 1,848 | 140 | 160 | 24 |
| 404 | 6,410 | 340 | 1,035 | 510 | 680 | 8,621 | 730 | 676 | 275 |
| 436 | 28,011 | 1,379 | 2,288 | 1,650 | 1,350 | 10,299 | 1,499 | 1,100 | 1,670 |
| 546 | —$^1$ | 68,027 | 3,906 | 3,717 | 1,969 | 21,322 | 1,580 | 1,751 | 6,000 |
| 579 | — | —$^2$ | 5,495 | 6,711 | 1,901 | 26,178 | 2,299 | 2,101 | 7,900 |

$^1$Estimated value: 1,500,000 micro J/cm$^2$.
$^2$Estimated value: 200,000 micro J/cm$^2$.
$^3$Al ion density - Example 11: low; Example 12: high. (See Table I).
$^4$Best non-reactive ion preparation, for comparison.

vidual ion and is influenced to some extent by the presence of co-implanted species. Thus, for example, argon ion densities have ranged from 1×10$^{14}$ to 2×10$^{15}$ Ar+/cm$^2$, while neon ion densities have run from 1×10$^{14}$ to 1×10$^{17}$ Ne+/cm$^2$. Implantations have been carried out at an energy level of 100 to 500 keV.

The new high intrinsic sensitivities achieved by coimplantations of Ar with Ne (24 micro J/cm$^2$), Ar with Ne and He (20 micro J/cm$^2$), and Fe and Ne (40 micro J/cm$^2$) compare most favorably with the BSO material whose sensitivity ranges from 10 to 30 micro J/cm$^2$. Currently, BSO is the most sensitive solid-state, erasable storage medium commercially available. However, the image stored in BSO is volatile; in contrast, that stored in PLZT is non-volatile, yet readily erasable. Nonvolatile storage and comparable photosensitivity offered by the positive ion implanted PLZT of the invention constitute clearly recognizable advantages over BSO.

In addition to the preferred positive ions already mentioned, it is anticipated and in accordance with the broadest aspect of the present invention that additional positive ions may be employed in implantation of PLZT.

The PLZT material used to produce the ion implanted plates 1a listed in the examples, supra, is a PLZT (7/65/35) ceramic, i.e., a ceramic having 7 atom percent lanthanum, and a zirconium to titanium ratio of 65 to 35 and wherein the zirconium is in the form of lead zirconate and the titanium is in the form of lead titanate.

Grain size may range from 1 to 10 microns, with an approximate average of 5 microns. The PLZT material may have contents within the range from 5 to 10 atom percent for lanthanum, 62 to 70 mole percent for zirconium, and from 38 to 30 percent for titanium.

Although the PLZT plate 1a described thus far has been of the FE-phase PLZT ceramic, i.e., ferroelectric phase PLZT material, similar results may be obtained with PLZT material having in coexistence both antiferroelectric phase (AFE) and ferroelectric (FE) phase materials. The use of coexisting AFE and FE PLZT material increases the overall contrast of the stored image.

To obtain the data shown in Table I, the light source employed was a 500 W mercury vapor lamp with about 100 milliwatts/cm$^2$ intensity with a 700 angstrom band width filter centered at 3650 angstroms. Similar image storage has been obtained with a light source of about 15 milliwatts/cm$^2$ intensity with a 200 angstrom band width filter centered at the 3650 angstrom line.

Figure 3:
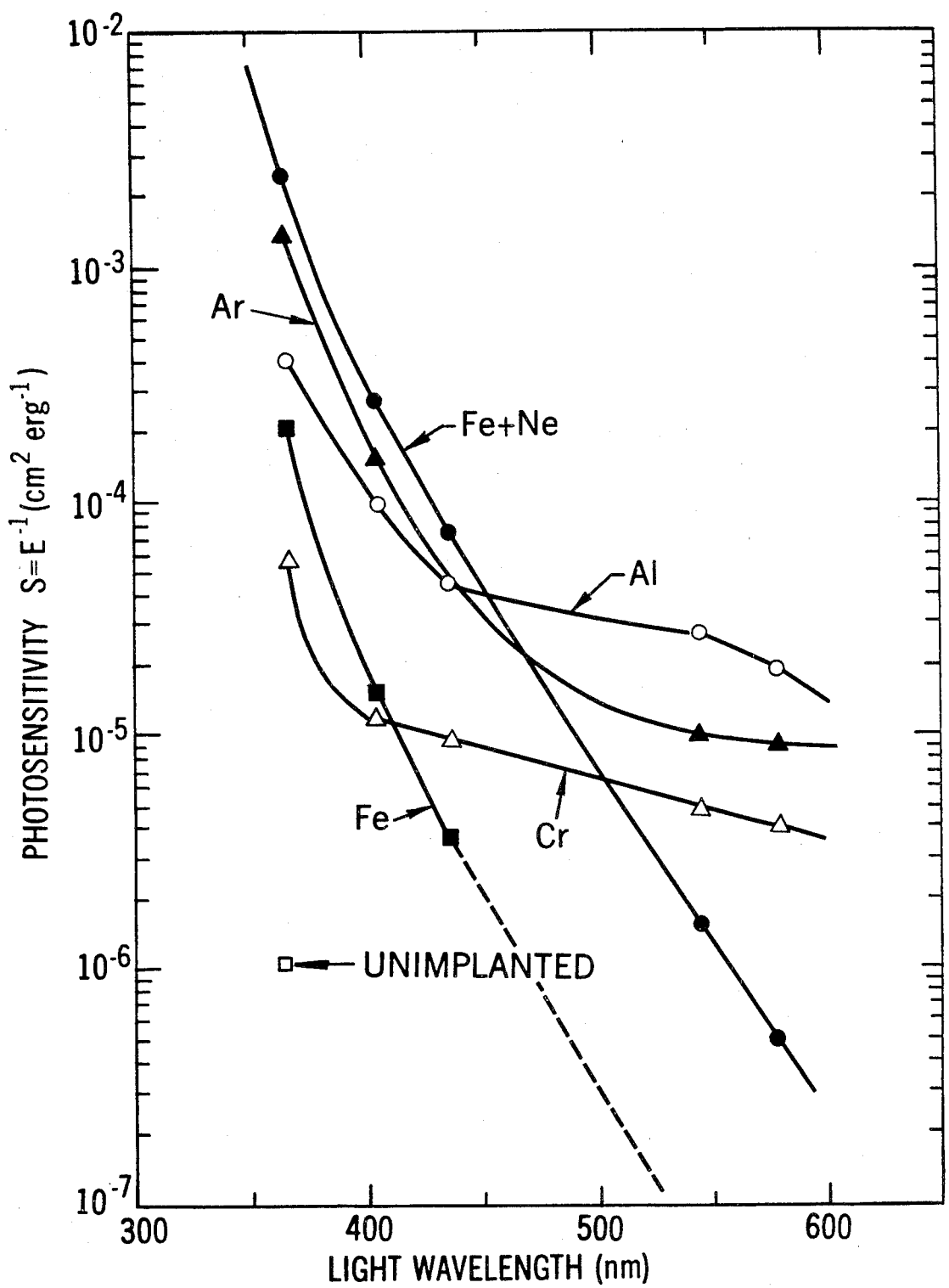
FIG. 3 is a graph depicting the hysteresis loop imposed by the electric field generator used in the preparation of ceramic plates.

With respect to the graph in FIG. 3, a more detailed explanation of the process for storage and erasure of photoferroelectric images is now presented. Related prior art disclosure is found in the literature references mentioned above in the discussion of the background of the invention. Preferably, voltage source 3a, namely a battery, is connected through a double pole, double throw (DPDT) switch 4a to the electrodes 2a. This simple circuit serves as an example of one electric field generator that may be used for the process of storing (and erasure) of the image on plate 1a.

Thus, in the graph, the vertical axis indicates ferroelectric polarization (P), and the horizontal axis indicates applied electric field (E) induced by the generator. To store an image using the PFE effect, the remanent polarization of the ceramic plate 1a is first switched to a point near saturation remanence, namely point F (see FIG. 3). The image is then exposed on one of the surfaces of the ceramic and the polarization is switched from F to G. The UV illumination is removed and the polarization is switched to H to obtain a positive image, or to J to obtain a negative image. The stored image may subsequently be switched from a positive to a negative or vice-versa without further exposure to UV light.

To erase the image, the surface of the plate is illuminated with UV light of uniform intensity, and the polarization is switched to saturation remanence at B, as shown by the dashed lines in FIG. 3.

It has been discovered that the crystal lattice disorder brought upon by the ion implantation in the PLZT material tends to shift the absorption of the ion implanted PLZT material toward the visible spectrum. The significance of this absorption shift is that the PLZT material becomes sensitive to visible, namely blue light. Images have been stored in Ar$^+$ implanted PLZT using blue light with negligible UV component present. The photosensitivity to blue light is less than that to near-UV, but it is significant in that it demonstrates that the absorption may be tailored by ion implantation. A phenomenonlogical model indicates, and as best understood at the present time, implanting PLZT material with positive ions results in a decrease of the dark conductivity of the implanted material and a concomitant increase in the photoconductivity of the implanted material. The changes in conductivity from the ion implantation result from disturbances and disorder created in the crystal lattice of the PLZT material by the implanted ions. Ion implantation depth is increased by implanting ions with low mass or with high implantation energies. The dark conductivity of the implanted region is reduced by maximizing implantation disorder with more massive ions. One means of achieving both of these desirable results is by co-implanting positive ions of two different masses, as the examples have shown. These co-implanted PLZT plates are particularly appreciated when relatively low level ambient light, such as sunlight, or typical fluorescent or incandescent light constitute the only source of energy.

A particular area of application of the positive ion implanted PLZT plate 1a may be in a system for inspection of photographic negatives on a roll of film for selection purposes before the negatives are developed into positive prints. A negative image can be established and stored as a positive image with the ion implanted PLZT plate 1a using a relatively low power light source. After viewing and/or storage, the image can be erased, and a new image can be viewed from a different negative. Thus, the process of editing a wole roll of film is greatly facilitated resulting in a savings of both time and materials that are not consumed in developing prints which may be discarded. Such an application would be especially useful to a newspaper or other periodical publishers.

Another broad area of application is in receiving images over telephone lines. Because of the increased photosensitivity of the ion implanted PLZT ceramic, a scanning laser of relatively low energy and high modulation speed can be used to scan an image onto the ceramic plate 1a. The disposition of the image may be made a line at a time. Modulation of the intensity of the scanning laser to produce the image from digital or analog signals sent over the telephone line is anticipated.

In view of the foregoing, it is seen that by ion implantation of PLZT ceramic material, increased photosensitivity for high resolution, high contrast, and non-volatile image storage and display may be obtained. The significant increase in photosensitivity results in the PLZT ceramic plate, such as plate 1a, of the invention being the most sensitive non-volatile, erasable image storage and display material currently available.

A number of positive ions, ion densities, and ion implantation energies are possible for a range of PLZT materials. The ion implanted PLZT material has its absorption spectrum shifted from the near-UV toward the visible blue spectrum.

The foregoing description of preferred and non-preferred embodiments of the invention has been presented for purposes of illustration and description. It is not intended to be exhaustive or to limit the invention to the precise form disclosed, and obviously many modifications and variations are possible in light of the above teaching. For example, other positive ions, including ions not disclosed herein may be found capable of giving comparable results. The embodiments were chosen and described in order to best explain the principles of the invention and its practical application, and thereby enable others skilled in the art to best utilize the invention in various embodiments and with various modifications as suitable for the particular use contemplated. It is intended that the scope of the invention be defined by the claims appended hereto.

We claim:

1. In a lead lanthanum zirconate titanate (PLZT) ceramic plate used for a photoferroelectric image storage and display device, the improvement comprising: the PLZT ceramic having a near surface region implanted with positive ions to provide enhanced photosensitivity of the plate in the near-UV spectrum, wherein said ions are selected from the group consisting of helium ions, hydrogen ions, argon ions, neon ions, aluminum ions, chromium ions, and iron ions, and are implanted below the surface of said PLZT plate at a depth of from 0.1 to 2 microns.

2. The PLZT ceramic plate of claim 1 wherein the implanted ions are selected from the group consisting of $H^+$, $He^+$, $Ar^+$, and $Ne^+$.

3. The PLZT ceramic plate of claim 1 wherein the ions implanted are chemically-reactive ions provided by elements of the group consisting of aluminum, chromium, and iron.

4. The PLZT ceramic plate of claim 2 wherein the implanted ions consist of $Ar^+$ coimplanted with other ions selected from the group consisting of $He^+$, $Ne^+$, and mixtures thereof.

5. The PLZT ceramic plate of claim 3 wherein the chemically-reactive ions selected are coimplanted with ions selected from the group consisting of $Ar^+$, $Ne^+$, $He^+$, and mixtures thereof.

6. The PLZT ceramic plate of claim 1 wherein the lanthanum is in the range from 5 to 10 and the ratio of zirconium titanium ranges from 62/38 to 70/30.

7. The PLZT ceramic plate of claim 1 wherein said ions are implanted with a density ranging from $1 \times 10^{12}$ to $1 \times 10^{17}$ ions/cm$^2$.

8. The PLZT ceramic plate of claim 1 wherein the energy of implantation of said ions is within the range from 100 to 500 keV.

9. The PLZT ceramic plate of claim 5 wherein said plate has ions of sufficient density and energy implanted to be sensitive to the visible light spectrum.

10. An article as described in claim 9 wherein said positive ions are selected from the group consisting of $H^+$, $He^+$, $Ne^+$, $Ar^+$, ions coimplanted with Fe, Al and Cr, and mixtures thereof.

11. The PLZT ceramic plate of claim 1 wherein said PLZT ceramic being treated included both antiferroelectric phase material and ferroelectric phase material to provide increased overall contrast.

* * * * *